United States Patent
Afzali-Ardakani et al.

(10) Patent No.: US 9,812,508 B2
(45) Date of Patent: Nov. 7, 2017

(54) HYBRID BIPOLAR JUNCTION TRANSISTOR

(71) Applicant: International Business Machines Corporation, Armonk, NY (US)

(72) Inventors: Ali Afzali-Ardakani, Ossining, NY (US); Bahman Hekmatshoartabari, White Plains, NY (US); Tak H. Ning, Yorktown Heights, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/361,471

(22) Filed: Nov. 27, 2016

(65) Prior Publication Data

US 2017/0077185 A1 Mar. 16, 2017

Related U.S. Application Data

(62) Division of application No. 14/827,266, filed on Aug. 14, 2015, now Pat. No. 9,508,777, which is a division
(Continued)

(51) Int. Cl.
| | | |
|---|---|---|
| *H01L 27/28* | (2006.01) | |
| *H01L 27/32* | (2006.01) | |
| *H01L 27/12* | (2006.01) | |
| *H01L 29/08* | (2006.01) | |
| *H01L 29/10* | (2006.01) | |

(Continued)

(52) U.S. Cl.
CPC .......... *H01L 27/286* (2013.01); *H01L 27/124* (2013.01); *H01L 27/1214* (2013.01); *H01L 27/3225* (2013.01); *H01L 27/3244* (2013.01); *H01L 27/3274* (2013.01); *H01L 29/0804* (2013.01); *H01L 29/0821* (2013.01); *H01L 29/1004* (2013.01); *H01L 29/66265* (2013.01); *H01L 29/7302* (2013.01);
(Continued)

(58) Field of Classification Search
None
See application file for complete search history.

(56) References Cited

U.S. PATENT DOCUMENTS

| 6,975,293 B2 | 12/2005 | Yen |
|---|---|---|
| 7,507,613 B2 | 3/2009 | Kawai |

(Continued)

FOREIGN PATENT DOCUMENTS

| CN | 101783363 | 7/2010 |
|---|---|---|
| JP | 2006303453 | 11/2006 |

(Continued)

OTHER PUBLICATIONS

Samarenda P. Singh et al., Electrical characteristics of zinc oxide-organic semiconductor lateral heterostructure based hybrid field-effect bipolar transistors, Applied Physics Letters vol. 98, Issue 7, Feb. 2011.

*Primary Examiner* — Long Pham
(74) *Attorney, Agent, or Firm* — Louis J. Percello; Otterstedt, Ellenbogen & Kammer, LLP (57) ABSTRACT

Bipolar junction transistors including inorganic channels and organic emitter junctions are used in some applications for forming high resolution active matrix displays. Arrays of such bipolar junction transistors are electrically connected to thin film switching transistors and provide high drive currents for passive devices such as organic light emitting diodes.

3 Claims, 7 Drawing Sheets

Related U.S. Application Data of application No. 14/184,384, filed on Feb. 19, 2014, now Pat. No. 9,147,715.

(51) Int. Cl.
  *H01L 29/73* (2006.01)
  *H01L 29/66* (2006.01)
  *H01L 51/05* (2006.01)
  *H01L 51/00* (2006.01)

(52) U.S. Cl.
  CPC ...... *H01L 29/7317* (2013.01); *H01L 51/0504* (2013.01); *H01L 51/0055* (2013.01); *H01L 2227/323* (2013.01)

(56) References Cited

U.S. PATENT DOCUMENTS

| | | |
|---|---|---|
| 8,114,785 B2 | 2/2012 | Lewis |
| 8,350,260 B2 | 1/2013 | Yeh |
| 8,354,666 B2 | 1/2013 | Lee |
| 9,147,715 B2 | 9/2015 | Afzali-Ardakani et al. |
| 2005/0275056 A1 | 12/2005 | Forrest |
| 2015/0236078 A1 | 8/2015 | Afzali-Ardakani et al. |
| 2015/0357386 A1 | 12/2015 | Afzali-Ardakani et al. |

FOREIGN PATENT DOCUMENTS

| | | |
|---|---|---|
| JP | 2006344884 | 12/2006 |
| TW | 201324886 | 6/2013 |

HYBRID BIPOLAR JUNCTION TRANSISTOR

CROSS-REFERENCE TO RELATED APPLICATIONS

This patent application is a divisional of U.S. patent application Ser. No. 14/827,266 filed Aug. 14, 2015, entitled "HYBRID BIPOLAR JUNCTION TRANSISTOR," which is in turn a divisional of U.S. patent application Ser. No. 14/184,384 filed Feb. 19, 2014, entitled "HYBRID BIPOLAR JUNCTION TRANSISTOR." The complete disclosures of the aforementioned U.S. patent application Ser. Nos. 14/827,266 and 14/184,384 are expressly incorporated herein by reference in their entireties for all purposes.

FIELD

The present disclosure relates to thin-film electronic device structures and technology and, more particularly, to bipolar junction transistors, active matrix structures such as backplanes incorporating such transistors, and the fabrication of bipolar junction transistors and active matrix structures using both inorganic and organic materials.

BACKGROUND

Bipolar junction transistors include emitter, collector and base regions. A biasing voltage applied between a base contact and an emitter contact allows control of collector current. Bipolar junction transistors can be employed as switches or amplifiers. The operation of heterojunction bipolar transistors, which are a type of bipolar junction transistors, is based on a bandgap difference between the emitter and base. Significant current gains can be obtained through the use of heterojunction bipolar transistors. Active matrix devices such as displays (e.g. televisions, laptop monitors), imagers (e.g. x-ray imagers) and sensors typically use hydrogenated amorphous silicon (a-Si:H) and, in some applications, low-temperature poly-silicon (LTPS) thin-film transistor (TFT) backplanes on glass or, for flexible devices, clear plastic. However, for very high resolution applications (>1000 pixels per inch (ppi)), such as micro-displays or pico-projectors, the carrier mobility of a-Si:H (electron mobility of about 1 $cm^2$/Vs) is too low to provide sufficient drive current at short TFT channel widths. For applications requiring high drive current, such as active matrix organic light emitting diode (AMOLED) displays, it is necessary to shrink the gate length and/or increase the gate width of a-Si:H transistors. This leads to increasing the processing cost of a-Si:H active matrix circuits due to the relatively small gate lengths as well as a significant trade-off in display resolution due to larger gate widths. LTPS is more expensive than a-Si:H, but capable of providing higher drive currents. The device-to-device variation of threshold voltage and mobility in LTPS transistors requires compensation circuitry that limits the resolution of the active matrix. Single crystalline silicon (c-Si) has been used as an alternative for very high resolution backplanes, but processing c-Si can require high temperatures not compatible with glass substrates currently used in manufacturing a-Si:H or LTPS devices or clear plastic substrates that may be used.

BRIEF SUMMARY

In accordance with the principles discussed herein, hybrid bipolar junction transistors and active matrix structures including such transistors are provided.

A bipolar junction transistor is disclosed that includes a doped inorganic semiconductor layer, an emitter electrode, a base electrode and a collector electrode. A first structure is operatively associated with the emitter electrode for transporting charge carriers having a first charge type into the inorganic semiconductor layer and suppressing diffusion of charge carriers having a second charge type opposite from the first charge type from the inorganic semiconductor layer. The first structure is positioned between the emitter electrode and the inorganic semiconductor layer and includes a first organic semiconductor carrier transport layer for transporting the charge carriers having the first type. A second structure is operatively associated with the base electrode for transporting charge carriers having the second charge type into the inorganic semiconductor layer and suppressing diffusion of charge carriers having the first charge type from the inorganic semiconductor layer. The second structure is positioned between the base electrode and the inorganic semiconductor layer. A third structure is operatively associated with the collector electrode for transporting charge carriers having the first charge type into the inorganic semiconductor layer and suppressing diffusion of charge carriers having the second charge type from the inorganic semiconductor layer. The third structure is positioned between the collector electrode and the inorganic semiconductor layer.

An exemplary method includes obtaining a bipolar junction transistor including a doped crystalline inorganic semiconductor layer and emitter, base and collector contact structures operatively associated with the crystalline inorganic semiconductor layer. The emitter contact structure is configured for transporting charge carriers having a first charge type into the inorganic semiconductor layer and suppressing diffusion of charge carriers having a second charge type opposite from the first charge type from the inorganic semiconductor layer. The emitter contact structure includes a first organic semiconductor carrier transport layer for transporting the charge carriers having the first type. The method further includes causing diffusion of charge carriers having the first charge type into the inorganic semiconductor layer from the emitter contact structure and, within the emitter contact structure, suppressing diffusion of charge carriers having the second charge type opposite from the inorganic semiconductor layer. The bipolar junction transistor is caused to provide electrical current to an electronic device.

An exemplary structure includes an inorganic semiconductor layer adjoining an electrically insulating layer and an array of bipolar junction transistors, each of the bipolar junction transistors including an emitter contact structure operatively associated with the inorganic semiconductor layer. Each emitter contact structure is configured for diffusing a first type of charge carrier into the inorganic semiconductor layer and suppressing the diffusion of a second type of charge carrier opposite from the first type of charge carrier from the inorganic semiconductor layer. Each emitter contact structure includes an organic semiconductor carrier transport layer for facilitating transport of the charge carriers having the first type. The structure further includes an array of thin film switching transistors, each of the thin film switching transistors being electrically connected to one of the bipolar junction transistors, and an array of electronic devices, each of the electronic devices being electrically connected to one of the bipolar junction transistors.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

Enabling higher resolution displays due to relatively high drive current and/or low operation voltage compared to a-Si:H or organic TFTs;
 Same fabrication infrastructure for backplane and frontplane structures feasible;
 Low-temperature processing compatible with flexible and low-cost substrates;
 Larger minimum device feature size (channel length) compared to a-Si:H devices allowing lower lithography costs.
 Lower power consumption compared to a-Si:H or organic TFT backplanes due to lower operation voltages.

These and other features and advantages of the disclosed methods and structures will become apparent from the following detailed description of illustrative embodiments thereof, which is to be read in connection with the accompanying drawings.

DETAILED DESCRIPTION

Figure 1:
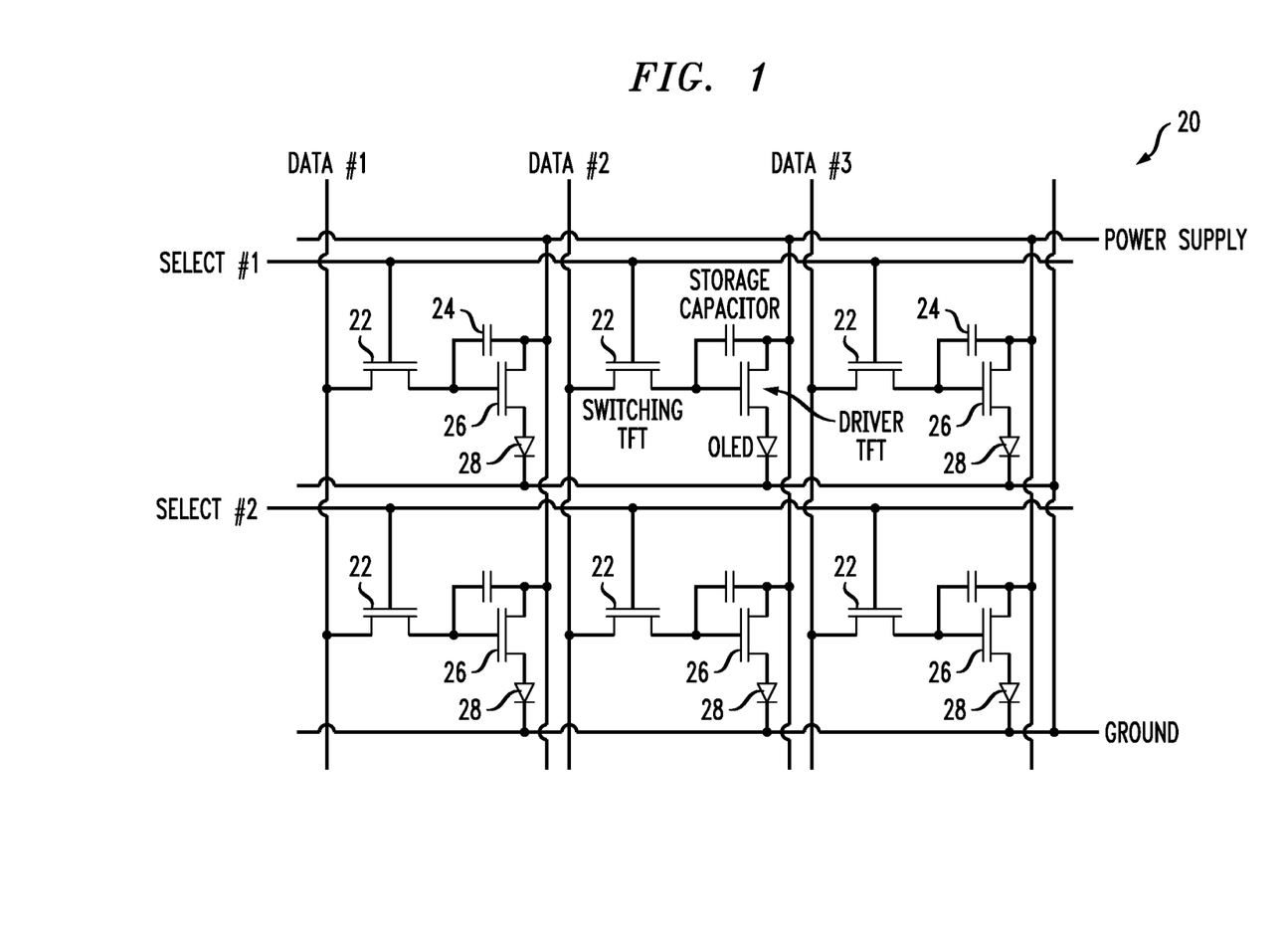
FIG. 1 shows a schematic illustration of active matrix pixel circuits in a TFT/OLED display.

Thin-film hybrid bipolar junction transistors are disclosed that include crystalline, inorganic channels and organic emitter junctions. Such transistors are used in some embodiments for forming high resolution active matrix displays. A backplane refers to an array of transistors (active devices) used for addressing and programming passive devices such as light emitting diodes, liquid crystal displays, photosensitive materials (e.g. for x-ray imaging), or sensors (e.g. piezoelectric materials for sensing pressure). The backplane also contains address lines, program lines, power supply lines, and typically storage capacitors which are fabricated using the same process technology as that of the transistors. Arrays of passive devices addressed/programmed by the backplane are typically referred to as the frontplane. An active matrix refers to the combination of a backplane and a frontplane. Schematic pixel circuits of active-matrix arrays comprised of OLEDs are illustrated in FIG. 1. An exemplary OLED includes one or more layers of organic electroluminescent material disposed between two electrodes. The circuit 20 illustrated in FIG. 1 is a 3×2 active matrix, i.e. comprised of six (6) pixels. A switching thin film transistor (TFT) 22, a storage capacitor 24, and a driver thin film transistor 26 are operatively associated with an OLED 28. One TFT 22 is employed to start and stop charging of a storage capacitor while the other 26 functions as a current source to provide a constant current for each pixel. The storage capacitor maintains a constant voltage on a charged pixel between refresh cycles. The frontplane of passive elements (OLEDs) is integrated, e.g. laminated, onto a backplane including an array of TFT elements to control current flowing to the passive elements. The select and data lines respectively transfer the switching and programming/readout signals. As discussed below, hybrid driver thin film transistors having crystalline channels and organic emitter junctions are disclosed that provide a high and stable drive current for passive devices such as OLEDs thus allowing high resolution and low power consumption.

High resolution active matrix structures are fabricated using techniques described below. A backplane layer including active semiconductor devices is formed in some embodiments using a semiconductor-on-insulator substrate. The semiconductor-on-insulator substrate may be prepared by various layer transfer techniques known in the art such as controlled spalling, epitaxial layer lift-off or SMART CUT®. In these techniques, a thin layer of crystalline semiconductor is transferred from a host substrate and bonded onto an insulating handle (carrier) substrate. The transfer and/or bonding methods are different in different techniques. Driver transistors as disclosed herein are formed using the semiconductor layer of the substrate along with additional circuit elements that provide other functions such as computing or sensing. In other embodiments, the starting substrate is fabricated by crystallization of non-crystalline materials grown on an insulating substrate using known techniques such as laser crystallization. Substantially higher drive currents and/or lower operation voltages may be obtained compared to a-Si:H or organic TFTs due to the higher mobility of crystalline channels in the driver transistors. As used herein, the term "crystalline" refers to single-crystalline (mono-crystalline), or poly-crystalline (multi-crystalline); the term "non-crystalline" refers to amorphous, nano-crystalline and micro-crystalline. Although the use of crystalline channel materials provide substantial functional advantages over prior art structures, it will be appreciated by those skilled in the art that the principles of this disclosure are also applicable to non-crystalline channel materials.

Figure 2A:
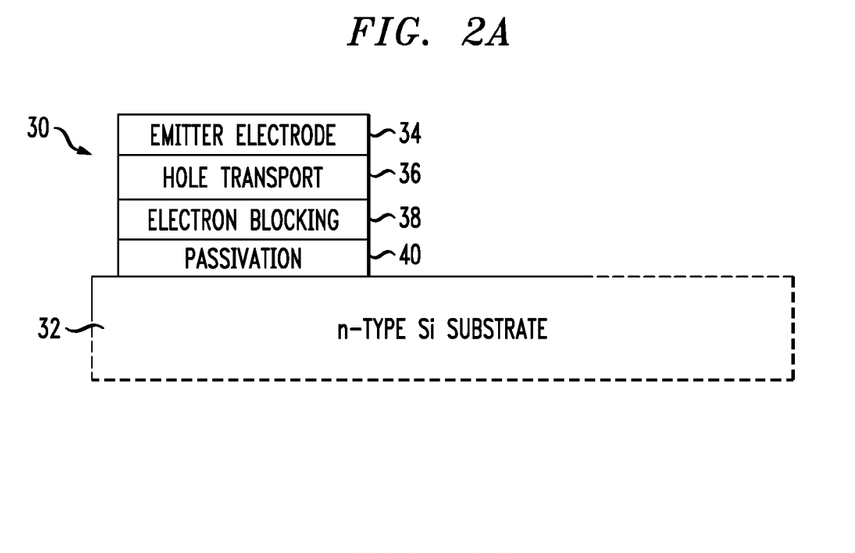
FIG. 2A shows a schematic illustration of an emitter region for a hybrid bipolar junction transistor.

FIG. 2A shows an exemplary schematic emitter contact structure 30 for a hybrid bipolar junction transistor on a doped crystalline silicon substrate layer 32. The substrate is n-type in this exemplary embodiment. As used herein, "n-type" refers to the addition of impurities that contribute free electrons to an intrinsic semiconductor. In a silicon containing substrate, examples of n-type dopants, i.e. impurities, include but are not limited to antimony, arsenic and phosphorous. The doped semiconductor layer 32 can be formed as a continuous layer as shown during fabrication of a semiconductor-on-insulator (SOI) wafer. Ion implantation can alternatively be employed following SOI substrate wafer fabrication to form the doped layer. The layer 32 is between 20 nm-1 µm in thickness in one or more embodiments. The doping concentration of the layer 32 is between $10^{15}$ to $10^{19}$ $cm^{-3}$ in one or more embodiments. The emitter structure 30 of the exemplary device includes an emitter electrode 34, a hole transport layer 36, an electron blocking layer 38 and a passivation layer 40. The emitter electrode is formed from a preferably high workfunction material such as gold, platinum, palladium or nickel. The hole transport layer 36 is a layer of organic semiconductor material. The electron blocking layer 38 and passivation layer 40, if employed, are preferably organic. Organic materials may be evaporated at or close to room-temperature or grown from a solution thus allowing lower growth costs compared to typical inorganic materials which require more complex growth techniques or more expensive precursors. In some embodiments, some or all of the blocking, passivation and transport functions are served by a single layer. The order of the transport layer 36 and the blocking layer 38 are reversed in some embodiments. It will be appreciated that the electron blocking layer may impede carrier transport due to band offset with respect to the transport layer 36 or inherent material property (effective mass). Examples of organic materials which can provide hole transport and/or electron blocking functions include but are not limited to pentacene, rubrene, anthracene, poly(3-hexylthiophene) (P3HT); tetraceno[2,3-b]thiophene; α-sexithiophene; poly(3,3'''-didodecylquaterthiophene); poly(2,5-bis(3-decylthiophen-2-yl)thieno[3,2-b]thiophene); N,N'-Bis(3-methylphenyl)-N,N'-diphenyl-benzidine (TPD); N,N'-Bis(phenanthren-9-yl)-N,N'-bis(phenyl)-benzidine (PAPB); 4,4'-Bis(N-carbazolyl)-1,1'-biphenyl (CBP); 1,3-Bis(N-carbazolyl)benzene (mCp); 4,4'-Cyclohexylidenebis[N,N-bis(4-methylphenyl) benzenamine] (TAPC); 2,2'-Dimethyl-N,N'-di-[(1-naphthyl)-N,N'-diphenyl]-1,1'-biphenyl-4,4'-diamine (α-NPD); 9,9-Dimethyl-N,N'-di(1-naphthyl)-N,N'-diphenyl-9H-fluorene-2,7-diamine (NPB); N,N'-Di-[(1-naphthyl)-N,N'-diphenyl]-1,1'-biphenyl)-4,4'-diamine (NPD); N,N'-Di(2-naphthyl-N,N'-diphenyl)-1,1'-biphenyl-4,4'-diamine (β-NPB); Tri-p-tolylamine; 4,4',4''-Tris[phenyl(m-tolyl)amino]triphenylamine; Tris(4-carbazoyl-9-ylphenyl)amine (TCTA); Tetra-N-phenylbenzidine (TPB); 1,3-Bis(triphenylsilyl)benzene; poly-aniline; poly(3,4-ethylenedioxythiophene); poly(3,4-ethylenedioxythiophene)-poly(styrenesulfonate) (PEDOT: PSS); poly(3,4-ethylenedioxythiophene); tetracyanoethylene; poly(thiophene-3-[2-(2-methoxyethoxy)ethoxy]-2,5-diyl); bis-poly(ethyleneglycol) (PEDOT:PEG); 7,7,8,8-Tetracyanoquinodimethane; and combinations thereof.

Figure 2B:
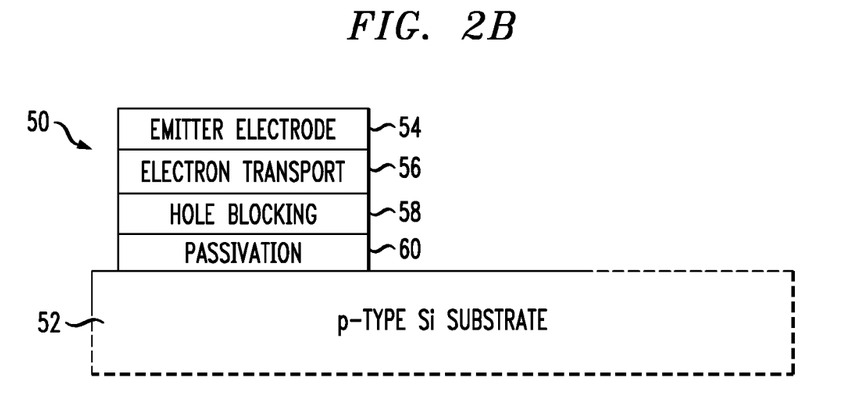
FIG. 2B shows a schematic illustration of an alternative embodiment of an emitter region for a hybrid bipolar junction transistor.

FIG. 2B shows an exemplary schematic emitter contact structure 50 for an alternative embodiment of a hybrid bipolar junction transistor on a doped crystalline silicon substrate layer 52. The substrate is p-type in this exemplary embodiment. In a silicon-containing substrate, examples of p-type dopants include but are not limited to boron, aluminum, gallium and indium. The doped layer 52 can be formed as a continuous layer as shown during fabrication of a semiconductor-on-insulator (SOI) wafer. Ion implantation can alternatively be employed following SOI substrate wafer fabrication to form the doped layer. The emitter contact structure 50 of the exemplary device includes an emitter electrode 54, an electron transport layer 56, a hole blocking layer 58 and a passivation layer 60. The emitter electrode is preferably formed from a low workfunction material such as erbium or magnesium. The electron transport layer 56 is a layer of organic semiconductor material. The hole blocking layer 58 and passivation layer 60, if employed, are preferably organic. In some embodiments, some or all of the blocking, passivation and transport functions are served by a single layer. The order of the transport layer 56 and the blocking layer 58 are reversed in some embodiments. Examples of organic materials which can provide electron transport and/or hole blocking functions include but are not limited to bathocuproine (BCP); bathophenanthroline (BPhen); 3-(Biphenyl-4-yl)-5-(4-tert-butylphenyl)-4-phenyl-4H-1,2,4-triazole (TAZ); 2-(4-Biphenylyl)-5-phenyl-1,3,4-oxadiazole (PBD); bis(8-hydroxy-2-methylquinoline)-(4-phenylphenoxy)aluminum; 2,5-Bis(1-naphthyl)-1,3,4-oxadiazole (BND); 2-(4-tert-Butylphenyl)-5-(4-biphenylyl)-1,3,4-oxadiazole (Butyl-PBD); Tris-(8-hydroxyquinoline) aluminum (Alq3); hexadecafluoro copper phthalocyanine ($F_{16}CuPc$); naphthalene diimide derivatives; perylene diimide derivatives; $C_{60}$; and combinations thereof.

Figure 3:
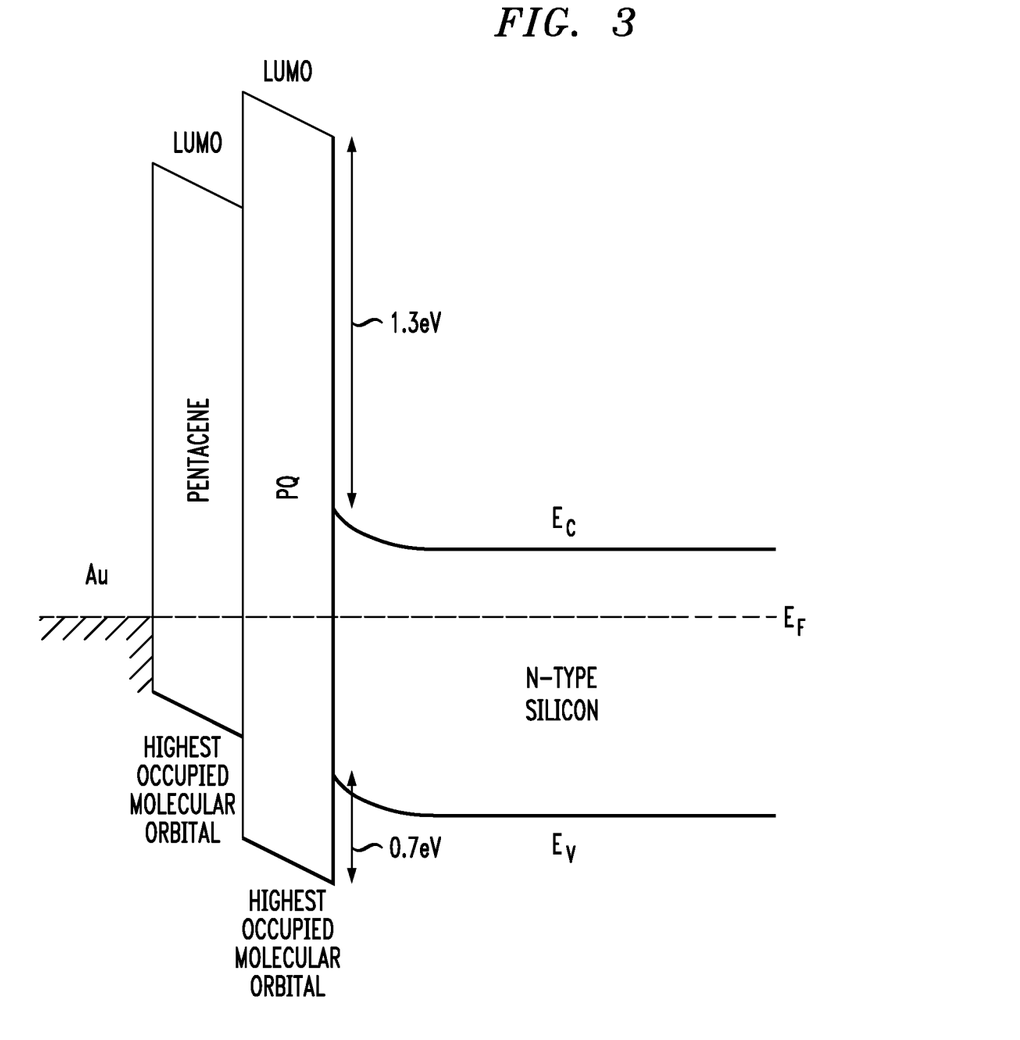
FIG. 3 shows an energy band diagram for an exemplary emitter region of a hybrid bipolar junction transistor.

FIG. 3 is an energy band diagram relating to a specific emitter structure such as that shown in FIG. 2A, though without a discrete electron blocking layer 38. In this exemplary embodiment, a high workfunction metal, namely gold, functions as a hole generator, generating holes in a pentacene layer that serves as the hole transport layer. Pentacene is an organic semiconductor material that loses electrons to gold, generating holes in the pentacene. The pentacene hole transport layer injects holes through the passivation layer into the n-type silicon layer primarily by diffusion. Due to its low electron affinity, pentacene also helps block electron diffusion from the n-type silicon layer towards the gold electrode. The passivation layer, for example a 9,10-phenanthrenequinone (PQ) layer, also helps block electron diffusion towards the gold electrode while serving its primary electrical passivation function with respect to the surface of the silicon layer. Lowest unoccupied molecular orbital (LUMO) and highest occupied molecular orbital levels are indicated for the pentacene and passivation (PQ) layers.

Figure 4:
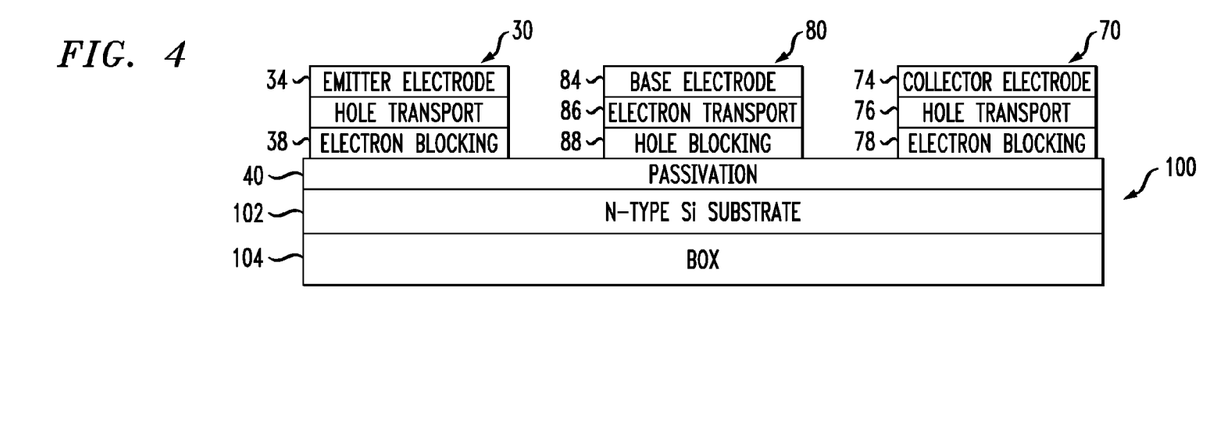
FIG. 4 shows a schematic illustration of an exemplary hybrid bipolar junction transistor.
Figure 5:
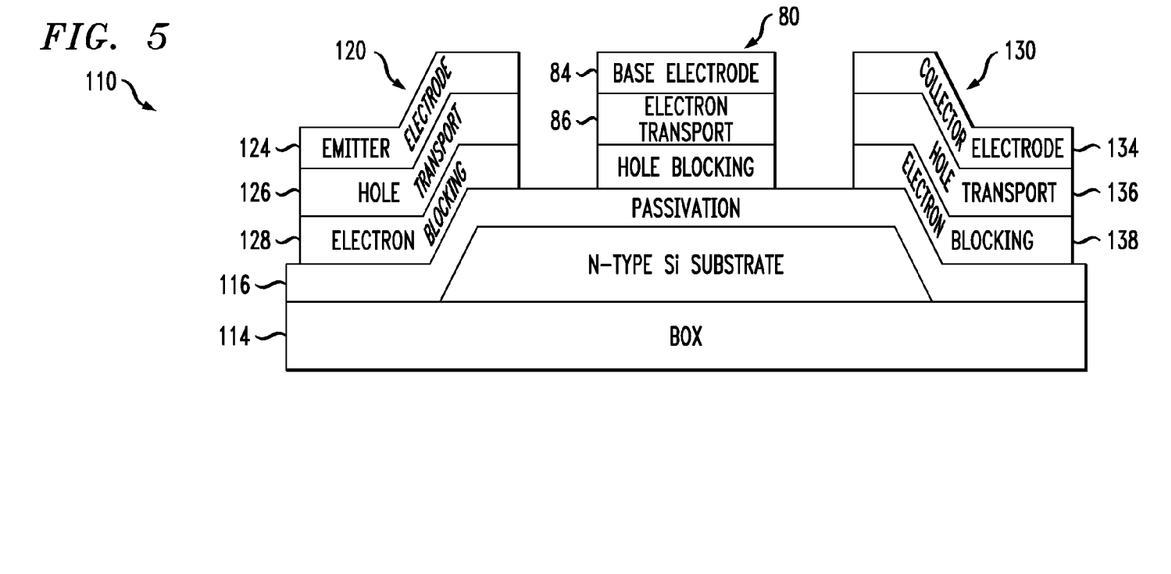
FIG. 5 shows a schematic illustration of an alternative exemplary hybrid bipolar junction transistor.

Exemplary hybrid bipolar junction transistor devices are shown in FIGS. 4 and 5. The same reference numerals are employed in the two figures to designate similar elements. The device 100 shown in FIG. 4 is formed using a substrate that includes an n-type crystalline semiconductor layer 102 that includes silicon. In some embodiments, the semiconductor layer 102 is a pure crystalline silicon layer doped with an n-type dopant. In other embodiments, the substrate is comprised of other group IV materials such as Ge, SiGe, SiC, SiGeC or GeC. In other embodiments, the substrate is comprised of III-V or II-VI compound semiconductors. The semiconductor layer directly contacts an electrically insulating layer 104. In one or more embodiments, the electrically insulating layer is a buried oxide (BOX) layer. The insulating layer 104 in an exemplary embodiment is between 5-200 nm, but may also be thicker or thinner for some applications. The electrically insulating layer 104 in one exemplary embodiment is a high quality silicon dioxide layer that is thermally grown, though other buried insulators such as boron nitride (BN) and aluminum oxide ($Al_2O_3$) may alternatively be employed in some embodiments. High quality buried oxides are generally characterized by relatively low interface trap densities ($D_{it}$). The exemplary device 100 includes an emitter structure 30 as shown in FIG. 2A. As discussed above, the emitter structure includes an emitter electrode 34, a hole transport layer 36 and an electron blocking layer 38. The collector structure 70 includes a collector electrode 74, a hole transport layer 76, and an electron blocking layer 78. The collector structure 70 and the emitter structure 30 have the same elements in some embodiments, which simplifies the fabrication process of the device 100. In other embodiments, the collector structure and emitter structure are formed at least in part from different materials. The base structure 80 of the device 100 includes a base electrode 84 such as a layer of low workfunction material, an electron transport layer 86, and a hole blocking layer 88. In some embodiments, the electron transport layer is an organic semiconductor layer. In preferred embodiments, all the transport, blocking and passivation layers are comprised of organic materials in order to take full advantage of the benefits of organic materials including the low cost and low-temperature processing capability. The thickness of the transport and blocking layers is typically in the range of 1-100 nm with the thickness range 5-50 nm being employed in one or more embodiments; however, it should be understood that thicker or thinner layers may be employed as well. The thickness of the passivation layer is typically in the range of 1-25 nm, although thinner or thicker layers may be employed as well. The thickness of the electrodes is typically in the range of 10-50 nm, although thinner or thicker layers may be employed as well.

In some embodiments, the silicon-based substrate layer is recessed using known techniques such as a selective etch process. A device 110 as schematically illustrated in FIG. 5 includes an n-type, silicon-based semiconductor layer 112 adjoining a buried oxide (BOX) layer 114. A passivation layer 116 directly contacts the semiconductor layer 112 as well as the buried oxide layer. The passivation layer 116 is preferably organic. Exemplary passivation materials include poly(3-hexylthiophene) (P3HT) and 9,10-phenanthrenequinone (PQ). Other passivation materials are known in the art and could possibly be employed. The passivation layer saturates the dangling bonds at the surface of the crystalline Si substrate and therefore reduces minority carrier recombination at the surface of the crystalline Si substrate. In some embodiments, the passivation layer is comprised of an organic monolayer formed by immersing the substrate is a solution of a long-chain alcohol or thiol. The device 110 includes a base structure 80 as described above with respect to the device 100. The emitter structure 120 and the collector structure 130 of the device 110 are formed on the passivation layer 116. While the base structure is formed entirely over the semiconductor layer 112, the emitter and collector structures 120, 130 are formed only partially over the semiconductor layer 112. The emitter structure includes an emitter electrode layer 124, a hole transport layer 126 and an electron blocking layer 128. As discussed above, the collector structure may include layers 134, 136, 138 that are the same as those present as the emitter structure to facilitate device fabrication. The base current may be reduced through the use of a recessed semiconductor layer, thereby increasing the current gain of the bipolar transistor device. It will be appreciated that devices similar to those shown in FIGS. 4 and 5 can be formed using emitter structures having electron transport and hole blocking layers substantially as shown in FIG. 2B. In such cases, the semiconductor layer would be p-type and the base structure would include hole transport and electron blocking layers. The exemplary devices 100, 110 provide an overall device function (e.g. electrical characteristics in a circuit) which is, in principle, the same as that of a conventional bipolar transistor. In that sense, the emitter portion of the exemplary devices 100, 110 is analogous to the emitter portion of a conventional p-n-p transistor which is comprised of a p+/n junction; the base portion of each exemplary device 100, 110 is analogous to the base portion of a conventional p-n-p transistor which is comprised of a n+/n junction, the collector portion of each exemplary device 100, 110 is analogous to the collector portion of a conventional p-n-p transistor which is comprised of a p+/n junction. The electrical operation of the devices 100, 110 as a circuit element is the same as that of a conventional p-n-p transistor. Similarly, if a p-type crystalline substrate is used, the disclosed devices are analogous to conventional n-p-n transistors.

Figure 6A:
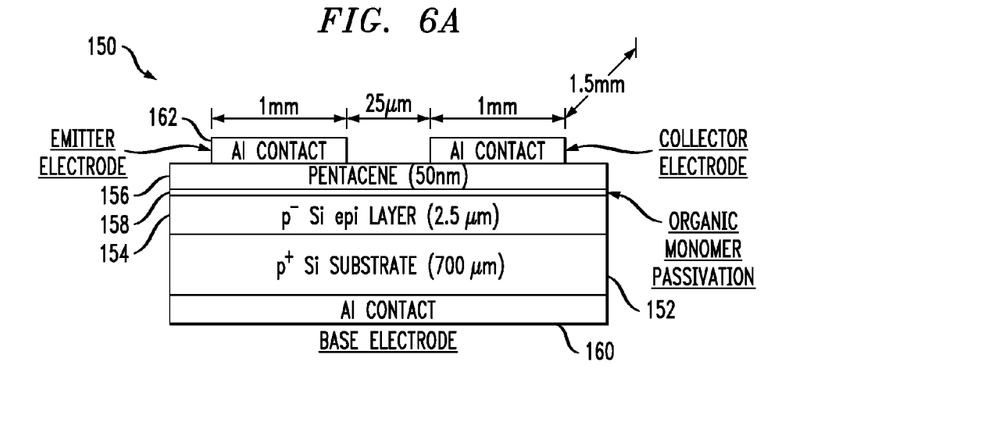
FIG. 6A shows a schematic illustration of an exemplary test structure including emitter and collection electrodes formed on an organic layer.
Figure 6B:
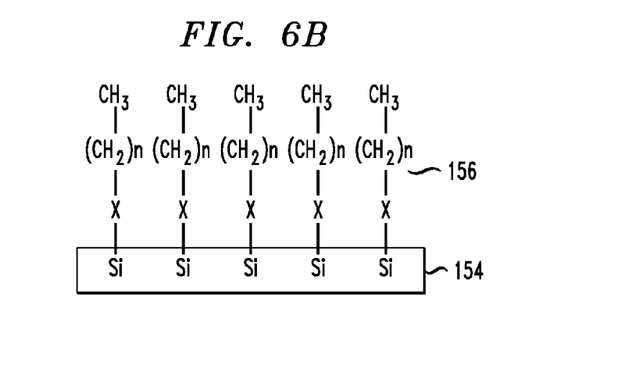
FIG. 6B is a greatly enlarged schematic illustration of a portion of the exemplary test structure shown in FIG. 6A.
Figure 7:
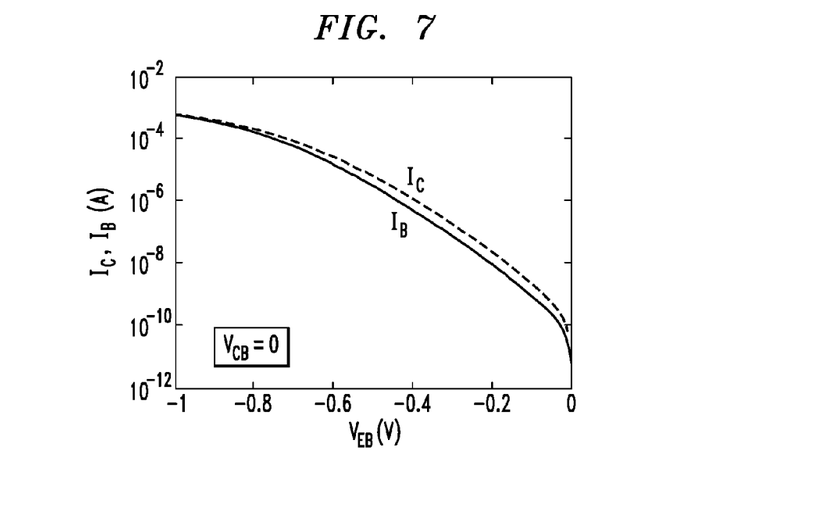
FIG. 7 is a graph showing collector and base current as a function of emitter-base voltage.

A simplified test device 150 is schematically illustrated in FIG. 6. The test device includes a crystalline silicon substrate including a heavily doped p+ layer 152 and a lightly doped p-type epitaxial layer 154. The layers 152, 154 have thicknesses of 700 μm and 2.5 μm, respectively. An organic monomer passivation layer 156 is formed on the top surface of the epitaxial layer 154 and a pentacene layer 158 is formed on the passivation layer. The organic monomer passivation is formed by first etching the native oxide of silicon in dilute hydrofluoric acid and immediately immersing the substrate in 1-dodecanol ($CH_3-(CH_2)_{11}-OH$) followed by heating at elevated temperatures (90-150° C.). Other long chain alcohols or thiols of the form $CH_3-(CH_2)_n-XH$ where element X refers to oxygen (O) or sulfur (S) and n is in the range of 4-21 may be also used. In this process, Si—H bonds of the etched silicon surface reacts with alcohol or thiol functionality and forms covalently bonded ether or thioether on the surface which passivates the surface, as illustrated in FIG. 6B. In this exemplary embodiment, the pentacene layer 158 has a thickness of approximately 50 nanometers (nm) and is formed by thermal evaporation at room temperature with an average evaporation rate of approximately 0.3 angstroms per second (Å/sec), using a solid (powder) evaporation source material having a purity of higher than 99%. (In other embodiments, the pentacene layer 158 may be alternatively formed using a solution containing a pentacene precursor such as 13,6-N-Sulfinylacetamidopentacene, and applied by spin-coating followed by curing. A solvent such as chloroform, chlorobenzene or combinations thereof may be used to prepare the solution. Curing may be performed at temperatures close to 200° C. in a dry atmosphere, although lower temperatures may be used as well.) An aluminum contact layer 160 directly contacts the substrate layer 152 and functions as a base electrode. Two aluminum contacts 162, 164 are formed on the pentacene layer, one functioning as an emitter electrode and the other as a collector electrode. The aluminum contacts 162, 164 were deposited by thermal evaporation at room temperature through a shadow mask, at an average evaporation rate of 5 Å/sec. As known in the art, a thin layer (typically 1-3 nm) of lithium fluoride (LiF) or other materials (such a transition metal oxides) may be disposed between the pentacene layer 158 and the aluminum contacts 168 and 164 (typically by thermal evaporation) to avoid chemical reaction between aluminum (Al) and pentacene and therefore improve the long-term chemical stability of the device. This step has been omitted in this exemplary embodiment for simplicity. (As known in the art, the LiF layer may also serve to improve electron injection from aluminum into pentacene by lowering the effective workfunction of the Al/LiF contact.) The base current of the test device is high resulting in a current gain of about two (2). This is because of large (1.5 $mm^2$) contact pads and large (25 μm) emitter-collector separation. Higher gain is expected with smaller contact pads and smaller collector-emitter separation. Bipolar function is clearly observed in the test device. FIG. 7 shows collector and base current of the test device 150 as a function of emitter-base voltage.

Figure 8:
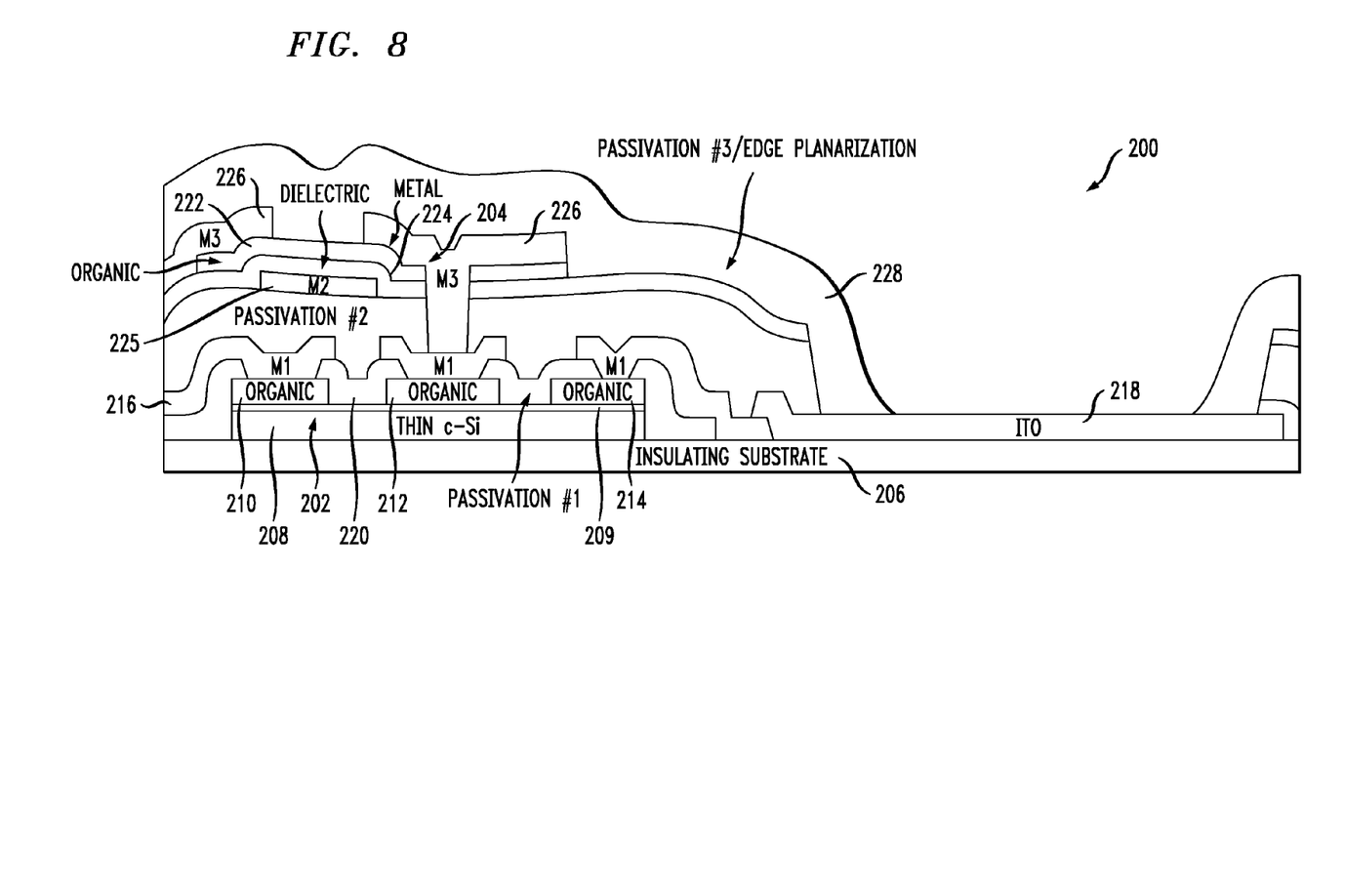
FIG. 8 is a schematic illustration of an exemplary backplane including a hybrid bipolar junction transistor functioning as a drive transistor.

An exemplary vertically integrated backplane 200 including hybrid bipolar junction transistors 202 is schematically shown in FIG. 8. In this exemplary embodiment, an organic thin film transistor 204, which functions as a switch, is integrated on top of each hybrid bipolar junction transistor. The hybrid bipolar junction transistors function as drive transistors for passive devices, such as OLEDs shown in FIG. 1. The active devices are formed on an insulating substrate 206. A thin crystalline silicon layer 208 adjoins the substrate 206. As discussed above with respect to FIGS. 2A and 2B, the silicon layer 208 can be n-type or p-type. Organic stacks 210, 212, 214 are formed on the silicon layer 208. The organic stacks correspond to passivation, hole transport, electron blocking, electron transport, and hole blocking layers such as those described above with respect to FIGS. 4 and/or 5. The metal layer 216 (M1) includes the emitter, base and collector electrodes of the hybrid bipolar junction transistor 202. Each hybrid bipolar junction transistor is electrically connected to an indium tin oxide (ITO) electrode 218. A first passivation layer 220 is formed on the silicon layer 208. The organic thin film transistors 204 in this exemplary embodiment are inverted-staggered bottom-gate devices. They include channels comprised of organic layers 222 and dielectric layers 224 formed between the channel layers and a metal layer 225. The transistors 204 are electrically connected to the drive transistors 202 by a metal layer 226 (M3). The drain of each transistor 204 is electrically connected to the base electrode of one of the hybrid bipolar junction transistors 202 in the exemplary embodiment as shown. The transistors 202, 204 are incorporated in a circuit as shown in FIG. 1 in some embodiments. A third passivation layer 228 is formed over thin film (switching) transistors 204. The passivation layers 209, 220, 221 and 228 are comprised of insulating materials which may or may not be organic. Inorganic passivation layers are preferably grown by thermal evaporation, e-beam evaporation or atomic layer deposition to avoid the use of plasma which may damage organic materials; however the growth methods involving plasma such as PECVD or sputtering may be used in some embodiments. Examples of inorganic insulators include but are not limited to silicon dioxide, silicon nitride, aluminum oxide, hafnium oxide or combinations thereof. Organic passivation layers are typically grown by thermal evaporation or spun from a solution. Examples of organic insulating materials that can be employed for one or more of the passivation layers include but are not limited to parylene, polyimide, polystyrene and polyvinyl alcohol (PVA). In some embodiments, the organic insulating materials may include a photo-sensitizing material to facilitate the patterning of these materials using photolithography. In one example, ammonium dichromate is used as a photo-sensitizer in a PVA solution and applied by spin coating. In some embodiments the passivation layer 228 may also serve as an edge planarization layer to avoid shorts between the OLED cathode (not shown) and the OLED anode, layer 218 (e.g. ITO). In some embodiments edge planarization may be facilitated by a reflow process which involves low temperature annealing of a polymeric passivation layer after spin-coating and patterning the polymeric passivation layer. Amorphous silicon is not required in the exemplary backplane. The fill factor of each pixel is improved by reducing the active device area, thus providing more area for the OLED (not shown) operatively associated with each switching and drive transistor. It will be appreciated that, in alternative embodiments of the backplane, the organic thin film transistors 204 may be incorporated on the side rather than on top of the electrically associated drive transistors 202.

Figure 9:
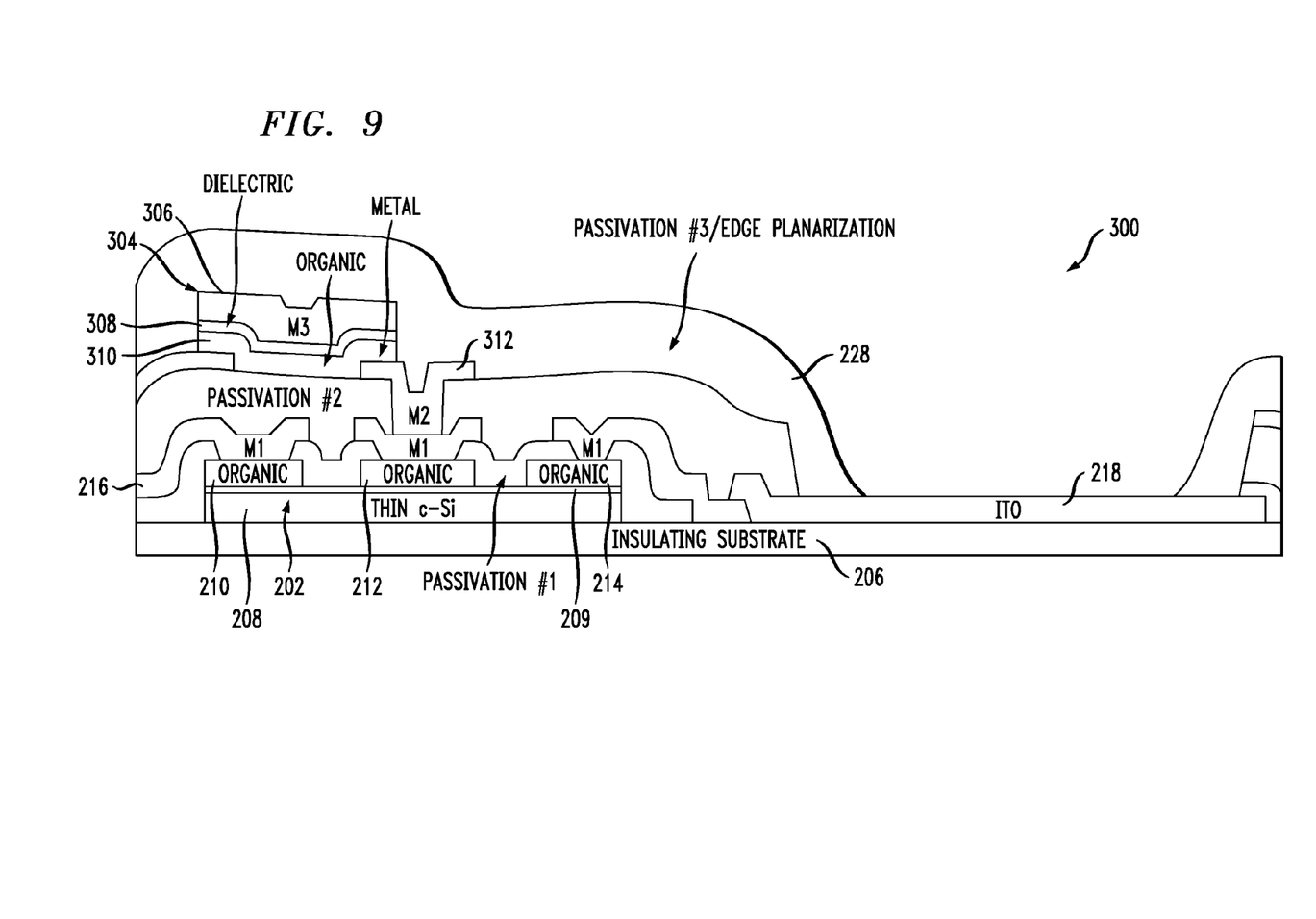
FIG. 9 is a schematic illustration of an alternative embodiment of an exemplary backplane including a hybrid bipolar junction transistor functioning as a drive transistor.

A second exemplary vertically integrated backplane 300 is shown in FIG. 9. The backplane 300 includes elements that are also found in the backplane 200 discussed above and are designated with the same reference numerals. In this exemplary embodiment, a top-gate staggered organic thin film transistor 304 is electrically connected to a thin-film drive transistor 202. A metal layer 306 (M3) adjoins a gate dielectric layer 308. Materials such as silicon dioxide or high-k materials such as $HfO_2$ or $Al_2O_3$ can be employed as gate dielectric layers. Organic dielectric layers such as parylene and polyimide are used in some embodiments. An organic channel layer 310 adjoins the gate dielectric layer. Each thin film switching transistor 304 is electrically connected to the base electrode of a drive transistor 202 by a second metal layer 312.

A silicon-on-insulator (SOI) wafer comprised of a thin crystalline semiconductor layer on a buried oxide (BOX) insulator, which is in turn on a bulk silicon (handle) substrate is employed in some embodiments as a starting substrate for fabricating hybrid bipolar junction transistors, such as the transistors described above. The hybrid transistors are characterized by their inclusion of both a silicon-containing and organic semiconductor elements as electrically active parts of the devices. The thickness of the semiconductor layer is between 20 nm-1 µm in some exemplary embodiments although thinner or thicker layers may be used as well. Relatively thin semiconductor layers facilitate the production of mechanically flexible active matrix structures. Exemplary single crystal materials for the crystalline semiconductor layer include silicon and silicon-containing films such as silicon germanium. Compound III-V and II-VI semiconductors may also be used. The insulator layer 34 in an exemplary embodiment is between 5-200 nm, but may also be thicker or thinner for some applications.

Given the discussion thus far and with reference to the exemplary embodiments discussed above and the drawings, it will be appreciated that, in general terms, an exemplary bipolar junction transistor is provided that includes a doped, inorganic semiconductor layer 102 or 112, an emitter electrode 34 or 124, a base electrode 84, and a collector electrode 74 or 134, as shown in the exemplary devices depicted in FIGS. 4 and 5. A first organic semiconductor transport layer 36 or 126 is operatively associated with the emitter electrode for injecting charge carriers having a first charge type into the semiconductor layer. The first organic transport layer is positioned between the emitter electrode and the semiconductor layer and forms part or all of a first structure positioned between the emitter electrode and the inorganic semiconductor layer that facilitates diffusion of the charge carriers having the first charge type into the inorganic semiconductor layer and suppresses diffusion of charge carriers having a second charge type opposite from the first charge type. In some embodiments, the organic transport layer suppresses diffusion of the charge carriers having the second charge type from the inorganic semiconductor layer towards the emitter electrode in addition to facilitating diffusion of the charge carriers having the first charge type into the inorganic semiconductor layer. A second transport layer 86 is operatively associated with the base electrode 84 for transporting charge carriers having a second charge type opposite from the first charge type. In other words, if the first organic semiconductor transport layer comprises hole transport material for injecting holes into the crystalline inorganic semiconductor layer, the second transport layer is selected for transporting electrons. The second transport layer is positioned between the base electrode and the semiconductor layer and forms all or part of a second structure operatively associated with the base electrode for transporting charge carriers having the second charge type and suppressing diffusion of charge carriers having the first charge type. The second structure is positioned between the base electrode and the inorganic semiconductor layer. A third transport layer 76 or 136 is operatively associated with the collector electrode for transporting charge carriers having the first charge type and is positioned between the collector electrode and the inorganic semiconductor layer. Carrier blocking layers such as layers 38, 88, 78 are provided within emitter, base and collector contact structures in one or more embodiments. Carrier blocking may be provided by discrete layers or by carrier transport and/or passivation layers. A passivation layer 40 or 116 is provided in one or more embodiments. The passivation layer saturates dangling bonds at the surface of an inorganic crystalline semiconductor substrate and reduces minority carrier recombination at the surface of the substrate. In one or more embodiments, the passivation layer suppresses majority carrier diffusion from the inorganic semiconductor substrate into the organic contact structure and therefore functions as a carrier blocking layer in addition to a surface passivation layer. The organic semiconductor material includes pentacene in one or more embodiments. The inorganic crystalline semiconductor layer is an n-type crystalline silicon layer in some embodiments and a p-type crystalline silicon layer in other exemplary embodiments. A silicon substrate is recessed in some embodiments, such as shown in FIG. 5, wherein the emitter structure and collector structure are only partially formed over the inorganic semiconductor layer.

An exemplary method includes obtaining a bipolar junction transistor including a crystalline inorganic semiconductor layer and emitter, base and collector contact structures (for example, structures 30, 80, 70 as shown in FIG. 4) operatively associated with the crystalline inorganic semiconductor layer (for example, layer 102 in FIG. 4). The emitter contact structure comprises an organic semiconductor material and includes one of electron-transport/hole blocking and hole-transport/electron-blocking layers. The contact structure 50 shown in FIG. 2B is an exemplary electron-transport/hole blocking structure. The contact structure 30 shown in FIGS. 2A and 4 is an exemplary hole-transport/electron blocking structure. Further steps include causing diffusion of a first type of charge carrier (e.g. electrons or holes) into the crystalline inorganic semiconductor layer from the emitter contact structure and, within the emitter contact structure, suppressing diffusion of a second type of charge carrier opposite to the first type of charge carrier from the crystalline inorganic semiconductor layer. The method further includes causing the bipolar junction transistor to provide an electrical current (e.g. a DC current) to an electronic device such as a passive device. In one or more embodiments, the passive device is an OLED 28 as shown in the circuit diagram provided in FIG. 1.

A structure provided in accordance with one or more embodiments includes a crystalline inorganic semiconductor layer adjoining an electrically insulating layer and an array of bipolar junction transistors. Each of the bipolar junction transistors includes an emitter contact structure operatively associated with the crystalline inorganic semiconductor layer. The emitter contact structures each comprise one of an electron-transport and hole blocking structure and a hole-transport and electron-blocking structure for diffusing a first type of charge carrier into the crystalline inorganic semiconductor layer and suppressing the diffusion of a second type of charge carrier from the crystalline inorganic semiconductor layer. FIG. 2B shows a contact structure 50 that provides electron transport and hole blocking. FIG. 2A shows an emitter contact structure 30 that provides hole transport and electron blocking. In both exemplary structures 30, 50, the transport layer is an organic semiconductor material layer. As discussed above with respect to FIG. 3, pentacene is an organic semiconductor layer that can be employed for hole transport. An array of thin film switching transistors is electrically connected to the bipolar junction transistors. FIG. 1 illustrates exemplary electrical connections of switching transistors with driver thin film transistors such as the bipolar junction devices 100, 110 as described above. FIGS. 8 and 9 provide more detailed views of electrical connections between switching transistors 204, 304 and bipolar junction transistors 202. An array of passive devices is further provided, each of the passive devices being electrically connected to one of the bipolar junction transistors. FIG. 1 shows connections of passive devices, namely OLEDs 28, to bipolar junction transistors 26 having structures as described above with respect to FIGS. 4 and 5. In some embodiments, each emitter contact structure includes an emitter electrode 34 comprised of high workfunction material such as gold and an organic semiconductor hole transport layer 36 for injecting holes into the crystalline inorganic semiconductor layer by diffusion. In other exemplary embodiments, each emitter contact structure includes an emitter electrode 54 comprised of low workfunction material and an electron transport layer 56 for injecting electrons into the crystalline inorganic semiconductor layer by diffusion.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above", "below", "top" and "bottom" are generally employed to indicate relative positions as opposed to relative elevations unless otherwise indicated. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising
obtaining a bipolar junction transistor including a doped crystalline inorganic semiconductor layer and emitter, base and collector contact structures operatively associated with the crystalline inorganic semiconductor layer, the emitter contact structure configured for transporting charge carriers having a first charge type into the inorganic semiconductor layer and suppressing diffusion of charge carriers having a second charge type opposite from the first charge type from the inorganic semiconductor layer, the emitter contact structure including a first organic semiconductor carrier transport layer for transporting the charge carriers having the first type;
causing diffusion of charge carriers having the first charge type into the inorganic semiconductor layer from the emitter contact structure;
within the emitter contact structure, suppressing diffusion of charge carriers having the second charge type from the inorganic semiconductor layer, and
causing the bipolar junction transistor to provide electrical current to an electronic device.

2. The method of claim 1, wherein the electronic device is an organic light emitting diode, and wherein the step of causing the bipolar junction transistor to provide electrical current to the electronic device further includes causing a switching thin film transistor to send an electrical signal to the bipolar junction transistor.

3. The method of claim 1, wherein the emitter contact structure includes an emitter electrode operatively associated with the first organic semiconductor carrier transport layer, the emitter electrode and first organic semiconductor transport layer being configured for transporting holes into the inorganic semiconductor layer, wherein:
causing diffusion of charge carriers having the first charge type into the inorganic semiconductor layer includes causing diffusion of holes into the inorganic semiconductor layer, and
suppressing diffusion of charge carriers having the second charge type includes suppressing diffusion of electrons from the inorganic semiconductor layer towards the emitter electrode.

* * * * *